(12) United States Patent
Ikeda et al.

(10) Patent No.: US 11,870,447 B2
(45) Date of Patent: Jan. 9, 2024

(54) PHASE SYNCHRONIZATION DEVICE (71) Applicant: Mitsubishi Electric Corporation, Tokyo (JP)

(72) Inventors: Sho Ikeda, Tokyo (JP); Akihito Hirai, Tokyo (JP); Koji Tsutsumi, Tokyo (JP); Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 214 days.

(21) Appl. No.: 17/503,966

(22) Filed: Oct. 18, 2021

(65) Prior Publication Data

US 2022/0052699 A1    Feb. 17, 2022

Related U.S. Application Data

(63) Continuation of application No. PCT/JP2019/019312, filed on May 15, 2019.

(51) Int. Cl.
| | | |
|---|---|---|
| *H03L 7/081* | (2006.01) | |
| *H03L 7/097* | (2006.01) | |
| *H03L 7/099* | (2006.01) | |
| *H03L 7/093* | (2006.01) | |
| *G06F 7/501* | (2006.01) | |

(52) U.S. Cl.
CPC ............ *H03L 7/0814* (2013.01); *G06F 7/501* (2013.01); *H03L 7/093* (2013.01); *H03L 7/097* (2013.01); *H03L 7/0998* (2013.01)

(58) Field of Classification Search
CPC ......... H04B 7/0617; H04B 10/11; H03L 7/07; H03L 7/0814; H03L 7/093; H03L 7/097; H03L 7/0998; H01Q 3/34
See application file for complete search history.

(56) References Cited

U.S. PATENT DOCUMENTS

2020/0335866 A1* 10/2020 Wang ...................... H01Q 3/28

OTHER PUBLICATIONS

Shimura et al., "Millimeter-Wave TX Phased Array with Phase Adjusting Function between Transmitters for Hybrid Beamforming with Interleaved Subarrays", Proceedings of the 46th European Microwave Conference, Oct. 4-6, 2016, pp. 1572-1575.

* cited by examiner

*Primary Examiner* — David S Huang
(74) *Attorney, Agent, or Firm* — Birch, Stewart, Kolasch & Birch, LLP (57) ABSTRACT

A third signal having a phase intermediate between a first signal based on a reference signal and a second signal with a phase shifted by an element of a previous stage is generated, a signal obtained by shifting the phase of the third signal by a first phase shift amount is output as a second signal to an element of a subsequent stage, a phase difference between the third signal and a fourth signal obtained by shifting the phase of a first signal output from the element of the subsequent stage by the first phase shift amount is detected, and the first phase shift amount is controlled on the basis of the detected phase difference.

20 Claims, 10 Drawing Sheets

PHASE SYNCHRONIZATION DEVICE

CROSS REFERENCE TO RELATED APPLICATIONS

This application is a Continuation of PCT International Application No. PCT/JP2019/019312, filed on May 15, 2019, which is hereby expressly incorporated by reference into the present application.

TECHNICAL FIELD

The present invention relates to a phase synchronization device including a plurality of cascaded elements.

BACKGROUND ART

For example, a phase synchronization device including a plurality of elements with output phases equal to each other may be used for an active phased array antenna (APAA) or a very large scale integration (VLSI). Each of the elements detects a phase difference between the phase of a reference signal and the phase of a signal that is referred to, returns the phases so that the detected phase difference is 0, and can thus output a signal with a stable frequency.

Note that, when the number of elements increases, it is difficult to distribute the reference signal to the individual elements with an equal path length, and a phase rotation amount (referred to as a phase rotation amount A) due to the difference between the path lengths is added to the output phase of each of the elements. Furthermore, the phase rotation amounts (referred to as phase rotation amounts B) caused in the elements vary depending on the gains depending on the elements. As a result, the output phases of the elements may be deviated from each other.

For example, a phase synchronization device described in Non-patent Literature 1 detects and returns a phase difference between elements caused by the phase rotation amounts A and B to correct the phase difference between the output phases of the elements.

CITATION LIST

Non-Patent Literatures

Non-patent Literature 1: Toshihiro Shimura, Takenori Ohshima, Hiroshi Ashida, Shohei Ishikawa, Shunsuke Fujio, Atsushi Honda, Zhengyi Li, Kenichi Nishikawa, Chikara Kojima, Kazuyuki Ozaki, Masahiko Shimizu and Yoji Ohashi, "Millimeter-Wave TX Phased Array with Phase Adjusting Function between Transmitters for Hybrid Beamforming with Interleaved Subarrays", Proceedings of the 46th European Microwave Conference, October 2016, pp. 1572-1575.

SUMMARY OF INVENTION

Technical Problem

In the phase synchronization device described in Non-patent Literature 1, the elements are connected by lines for transmitting and receiving signals for synchronization of the output phases between the elements. Thus, in the phase synchronization device described in Non-patent Literature 1, phase rotation amounts (referred to as phase rotation amounts C) due to wire delays through the lines connecting the elements are caused in addition to the phase rotation amounts A and B, and these amounts cannot be distinguished from each other. Thus, in a case where the phase rotation amounts C have changed in addition to the phase rotation amounts A and the phase rotation amounts B by changes in environmental conditions, for example, there is a problem in that the phase differences between the output phases of the elements cannot be accurately corrected, and the output phases of the elements are not equal to each other.

The present invention has been made to solve the aforementioned problem, and an object thereof is to provide a phase synchronization device capable of making output phases of a plurality of elements equal to each other.

Solution to Problem

A phase synchronization device according to the present invention is a phase synchronization device including a plurality of cascaded elements, the elements each including a phase interpolator, a phase shifter, a phase comparator, and a control circuit, wherein the phase interpolator receives input of a first signal based on a reference signal input via a line and a second signal output from the phase shifter included in an element of a previous stage, and generates and outputs a third signal having a phase intermediate between the first signal and the second signal, the phase shifter outputs, as the second signal, the third signal with a phase shifted by a first phase shift amount to the phase interpolator included in an element of a subsequent stale, the phase comparator detects a phase difference between the third signal and a fourth signal obtained by shifting a phase of the first signal output from the element of the subsequent stage by the first phase shift amount, and the control circuit controls the first phase shift amount for the phase shifter on a basis of the phase difference detected by the phase comparator.

Advantageous Effects of Invention

According to the present invention, a third signal having a phase intermediate between a first signal based on a reference signal and a second signal phase shifted by an element of a previous stage is generated, a signal obtained by shifting the phase of the third signal by a first phase shift amount is output as a second signal to an element of a subsequent stage, a phase difference between the third signal and a fourth signal obtained by shifting the phase of a first signal output from the element of the subsequent stage by the first phase shift amount is detected, and the first phase shift amount is controlled on the basis of the detected phase difference. As a result, output phases of a plurality elements can be made equal to each other.

DESCRIPTION OF EMBODIMENTS

First Embodiment

Figure 1:
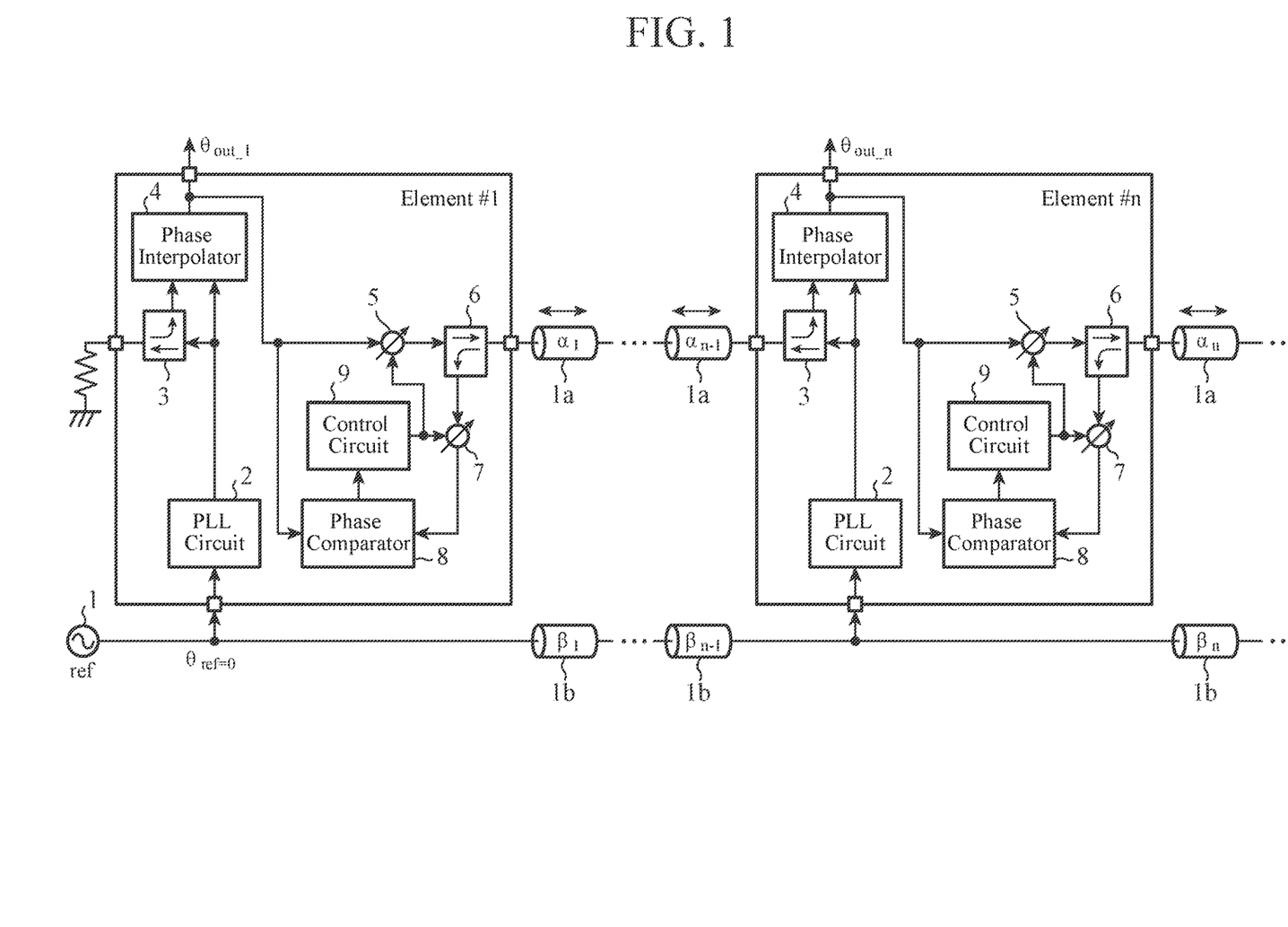
FIG. 1 is a block diagram illustrating a configuration of a phase synchronization device according to a first embodiment.

FIG. 1 is a block diagram illustrating a configuration of a phase synchronization device according to a first embodiment. The phase synchronization device illustrated in FIG. 1 is a device including a plurality of elements, which are cascaded by a line $1a$ for transmitting and receiving signals to/from each other and a line $1b$ through which a reference signal from a reference signal source 1 propagates. An n-th element #n (n=1, 2, . . . ) includes a PLL circuit 2 (phase synchronization circuit), a directional coupler 3. a phase interpolator 4, a variable phase shifter 5, a directional coupler 6, a variable phase shifter 7, a phase comparator 8, and a control circuit 9, receives input of a reference signal via the line $1b$, and generates and outputs a signal with a phase $\theta_{out\_n}$.

The PLL circuit 2 generates and outputs a first signal based on the reference signal input via the line $1b$. For example, the PLL circuit 2 performs frequency multiplication of the reference signal to output a signal with a known frequency (a signal with a radio frequency (RF)) higher than the frequency of the reference signal. Note that a phase rotation amount $\beta_1+\beta_2+\beta_3+ \ldots +\beta_{n-1}$ due to a wire delay is added to the phase of the reference signal input through the line $1b$. Thus, the phase $\theta_n$ of the first signal includes the phase rotation amount generated in the element #n and the phase rotation amount of the reference signal due to the wire delay.

The first signal with the phase $\theta_n$ generated by the PLL circuit 2 is output to the directional coupler 3 and the phase interpolator 4. The directional coupler 3 included in the element #n outputs the first signal to a previous ((n−1)-th) element #n−1 via the line $1a$. While the first signal propagates through the line $1a$ from the element #n to the element #n−1, a phase rotation amount $\alpha_{n-1}$ due to a wire delay is added to the phase $\theta_n$ of the first signal. In addition, the directional coupler 3 receives input of a second signal with a phase shifted by a variable phase shifter 5 included in the previous element #n−1 via the same line $1a$, and outputs the second signal to the phase interpolator 4. While the second signal propagates through the line $1a$ from the element #n−1 to the element #n, a phase rotation amount $\alpha_{n-1}$ due to a wire delay is added to the phase of the second signal.

The phase interpolator 4 included in the element #n receives input of the first signal with the phase $\theta_n$ output from the PLL circuit 2 and the second signal with the phase shifted in the element #n−1, and generates a third signal having a phase $\theta_{out\_n}$ that is intermediate between these signals. The third signal is output as an output signal from the element #n. Furthermore, the third signal generated by the phase interpolator 4 is also output to the variable phase shifter 5 and the phase comparator 8.

The variable phase shifter 5 is a first phase shifter that shifts the phase of an input signal by a phase shift amount $\gamma_n$, which is a first phase shift amount, controlled by the control circuit 9. The variable phase shifter 5 shifts the phase of the third signal output from the phase interpolator 4 by the phase shift amount $\gamma_n$, and outputs the third signal having a phase $\theta_{out\_n}+\gamma_n$ to the directional coupler 6. The directional coupler 6 included in the element #n outputs, as a second signal, the third signal input from the variable phase shifter 5 to an element #n+1 via the line $1a$. While the second signal propagates through the line $1a$ from the element #n to the element #n+1, a phase rotation amount un due to a wire delay is added to the phase $\theta_{out\_n}+\gamma_n$ of the second signal.

The directional coupler 6 receives input of a first signal, which is a signal with a phase $\theta_{n+1}$ output from a PLL circuit 2 included in the element #n+1, from the element #n−1 via the line $1a$, and outputs the first signal to the variable phase shifter 7. While the first signal propagates through the line $1a$ from the element #n+1 to the element #n, a phase rotation amount $\alpha_n$ due to a wire delay is added to the phase of the first signal.

The variable phase shifter 7 is a second phase shiftier that shifts the phase of an input signal by the same phase shift amount $\gamma_n$ as that of the variable phase shifter 5, and the phase shift amount $\gamma_n$ is controlled by the control circuit 9. The variable phase shifter 7 receives input of the first signal with the phase $\theta_{n+1}+\alpha_n$ from the element #n+1 via the line $1a$ and the directional coupler 6, and shifts the phase of the first signal by the phase shift amount $\gamma_n$ to generate a fourth signal having a phase $\theta_{n+1}+\alpha_n+\gamma_n$. The fourth signal generated by the variable phase shifter 7 is output to the phase comparator 8.

The phase comparator 8 receives input of the third signal output from the phase interpolator 4 and the fourth signal output from the variable phase shifter 7, and detects a phase difference between these signals. For example, the phase comparator 8 receives input of the third signal having the phase $\theta_{out\_n}$ n from the phase interpolator 4 and the fourth signal having the phase $\theta_{n+1}+\alpha_n+\gamma_n$ from the variable phase shifter 7, detects a phase difference between the input signals and outputs the detected phase difference to the control circuit 9.

The control circuit 9 controls the phase shift amount $\gamma_n$ for the variable phase shifter 5 and the variable phase shifter 7 on the basis of the phase difference detected by the phase comparator 8. For example, the control circuit 9 determines a phase shift amount $\gamma_n$ to reduce the phase difference detected by the phase comparator 8 to zero, and sets the determined phase shift amount $\gamma_n$ in each of the variable phase shifter 5 and the variable phase shifter 7.

Next, operation of the phase synchronization device according to the first embodiment will be described.

The phase $\theta_{out\_n}$ of the output signal (third signal) output from the element #n is made to be $\theta_{out\_n}=\theta_{n+1}+\alpha_n+\gamma_n$ by the phase comparator 8 and the control circuit 9 included in the element #n. In addition, as a result of similar operation in the previous element #n−1, the phase $\theta_{out\_n-1}$ of the output signal (third signal) output from the element #n−1 is $\theta_{out\_n-1}=\theta_n+\alpha_{n-1}+\gamma_{n-1}$. Furthermore, the phase interpolator 4 included in the element #n receives input of the first signal with the phase $\theta_n$ output from the PLL circuit 2 and the second signal having a phase $\theta_{out\_n-1}+\alpha_{n-1}+\gamma_{n-1}$ from the element #n−1 input by the directional coupler 3.

The phase interpolator 4 generates and outputs the third signal having a phase $\theta_{out\_n}$ that is intermediate between the phase $\theta_{out\_n-1}+\alpha_{n-1}+\gamma_{n-1}$ and the phase $\theta_n$. The phase $\theta_{out\_n}$ of the third signal is $\theta_{out\_n}=(\theta_{out\_n-1}+\alpha_{n-1}+\gamma_{n-1}+\theta_n)/2$.

$\theta_n$ the basis of $\theta_{out\_n-1}=\theta_n+\alpha_{n-1}+\gamma_{n-1}$, the output phase is $\theta_{out\_n}$ is $\theta_{out\_n}=\theta_{out\_n-1}$, and thus the output phase of the element #n-1 is the same as that of the element #n.

In contrast, a connection terminal for connection with a previous stage is terminated at the phase interpolator 4 included in a first element #1 because no previous element is present as illustrated in FIG. 1. Thus, no second signal from the directional coupler 3 is input to the phase interpolator 4 included in the first element #1. When no signal is input to one of the two inputs of the phase interpolator 4, the output phase is dependent only on the phase of the other of the two inputs. Thus, the output phase $\theta_{out\_1}$ of the phase interpolator 4 included in the element #1 is determined only by the phase $\theta_1$ of a signal input from the PLL circuit 2. As a result, output phases $\theta_{out\_1}$, $\theta_{out\_2}$, $\theta_{out\_3}$, . . . , $\theta_{out\_n}$, . . . are all equal to $\theta_{out\_1}$.

In addition, the order in which the operations of individual components settle is as follows.

First, the circuit 2 included in the element #1 locks, and the output phase $\theta_1$ thereof is determined.

Because the output phase $\theta_{out\_1}$ of the element #1 is dependent only on the phase $\theta_1$ of the first signal generated by the PLL circuit 2, the output phase $\theta_{out\_1}$ t is settled at this point. Subsequently, after the output phase of the PLL circuit 2 included in the element #2 is settled at $\theta_2$, the operations of the variable phase shifter 5, the variable phase shifter 7, the phase comparator 8, and the control circuit 9 included in the element #1 are settled, and the phase shift amount $\gamma_1$ is determined. In this manner, the output phase $\theta_{out\_2}$ of the element #2 is settled. Thereafter, the output phases $\theta_{out\_3}$, $\theta_{out\_4}$, . . . , $\theta_{out\_n}$, . . . settle through similar procedures.

As described above, the phase synchronization device according to the first embodiment includes the elements #1, #2, . . . , #n, . . . In the element #n, the third signal having a phase that is intermediate between the first signal based on the reference signal input via the line 1b and the second signal output from the element #n-1 is generated, a signal obtained by shifting the phase of the third signal by the phase shift amount is output as a second signal to the element #n+1, the phase difference between the third signal and the fourth signal, which is obtained by shifting a first signal output from the element #n+1 by the phase shift amount $\gamma_n$, is detected, and the phase shift amount $\gamma_n$ is controlled on the basis of the detected phase difference.

As a result, the phase synchronization device according to the first embodiment can make the output phases of a plurality of elements equal to each other independently of all of the phase rotation amount $\beta_n$ due to a wire delay caused by a path difference of the line 1b depending on each element, the phase $\theta_n$ including the phase rotation amount generated in the element #n, and the phase rotation amount $\alpha_n$ due to a wire delay of the line 1a.

Second Embodiment

Figure 2:
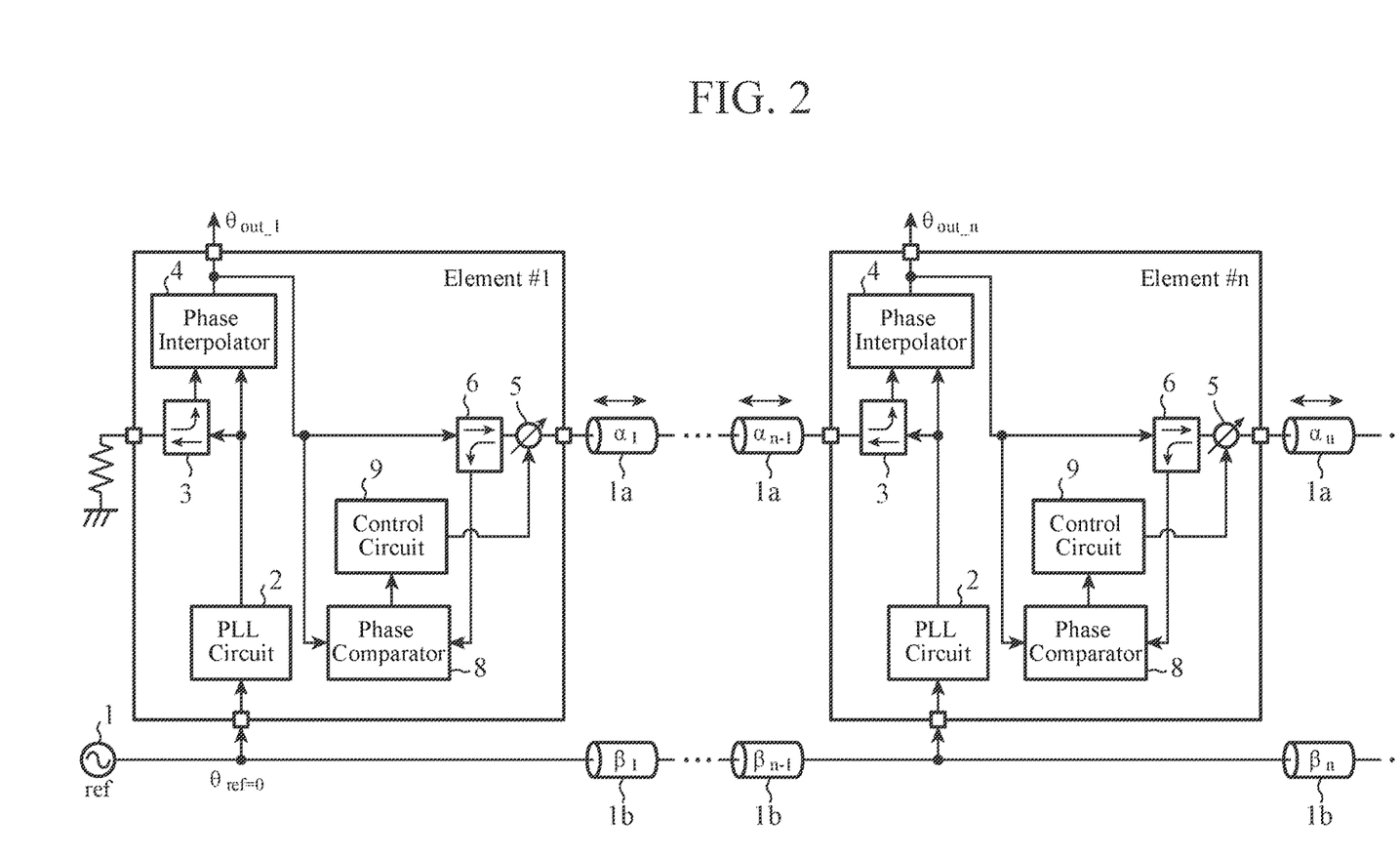
FIG. 2 is a block diagram illustrating a configuration of a phase synchronization device according to a second embodiment.

FIG. 2 is a block diagram illustrating a configuration of a phase synchronization device according to a second embodiment. The phase synchronization device illustrated in FIG. 2 is a device including a plurality of elements, which are cascaded by a line 1a for transmitting and receiving signals to/from each other and a line 1b through which a reference signal from a reference signal source 1 propagates. An n-th element #n includes a PLL circuit 2, a directional coupler 3, a phase interpolator 4, a variable phase shifter 5, a directional coupler 6, a phase comparator 8, and a control circuit 9, receives input of a reference signal via the line 1b, and generates and outputs a signal with a phase $\theta_{out\_n}$.

The phase synchronization device illustrated in FIG. 2 differs from the phase synchronization device according to the first embodiment in that the variable phase shifter 7 illustrated in FIG. 1 is not included and that the variable phase shifter 5 is disposed subsequent to the directional coupler 6, that is, between the directional coupler 6 and the subsequent element. In addition, the variable phase shifter 5 is a bidirectional phase shifter allowing bidirectional input and output.

In the element #n, the PLL circuit 2 generates and outputs a first signal with a known frequency and a phase $\theta_n$ from the reference signal input via the line 1b. The phase interpolator 4 receives input of the first signal output from the PLL circuit 2 and a second signal with a phase shifted by the variable phase shifter 5, which is a bidirectional phase shifter included in the element #n-1, and generates and outputs a third signal having a phase $\theta_{out\_n}$ that is intermediate between these signals. The directional coupler 6 outputs the third signal output from the phase interpolator 4 to the variable phase shifter 5. The variable phase shiftier 5 outputs, as a second signal, a signal obtained by shifting the phase of the third signal input from the phase interpolator 4 via the directional coupler 6 by the phase shift amount $\gamma_n$ to the element #n+1 via the line 1a.

The phase comparator 8 receives input of the third signal having the phase $\theta_{out\_n}$ output from the phase interpolator 4 and a fourth signal obtained by shifting the phase of a first signal output from the element #n-1 by the phase shift amount $\gamma_n$ by the variable phase shifter 5, and detects a phase difference between these signals. The control circuit 9 controls the phase shift amount $\gamma_n$ for the variable phase shifter 5 on the basis of the phase difference detected by the phase comparator 8. Fax example, the control circuit 9 determines a phase shift amount $\gamma_n$ to reduce the phase difference detected by the phase comparator 8 to zero, and sets the determined phase shift amount $\gamma_n$ in the variable phase shifter 5.

As described above, the phase synchronization device according to the second embodiment includes the elements #1, #2, . . . , #n, . . . Because the element #n includes, as a phase shifter, the variable phase shifter 5 that is a bidirectional phase shifter, effects similar to those in the first embodiment can be produced. Furthermore, the bidirectional phase shifter enables the functions of the variable phase shifter 5 and the variable phase shifter 7 illustrated in FIG. 1 to be achieved by one phase shifter.

Third Embodiment

Figure 3:
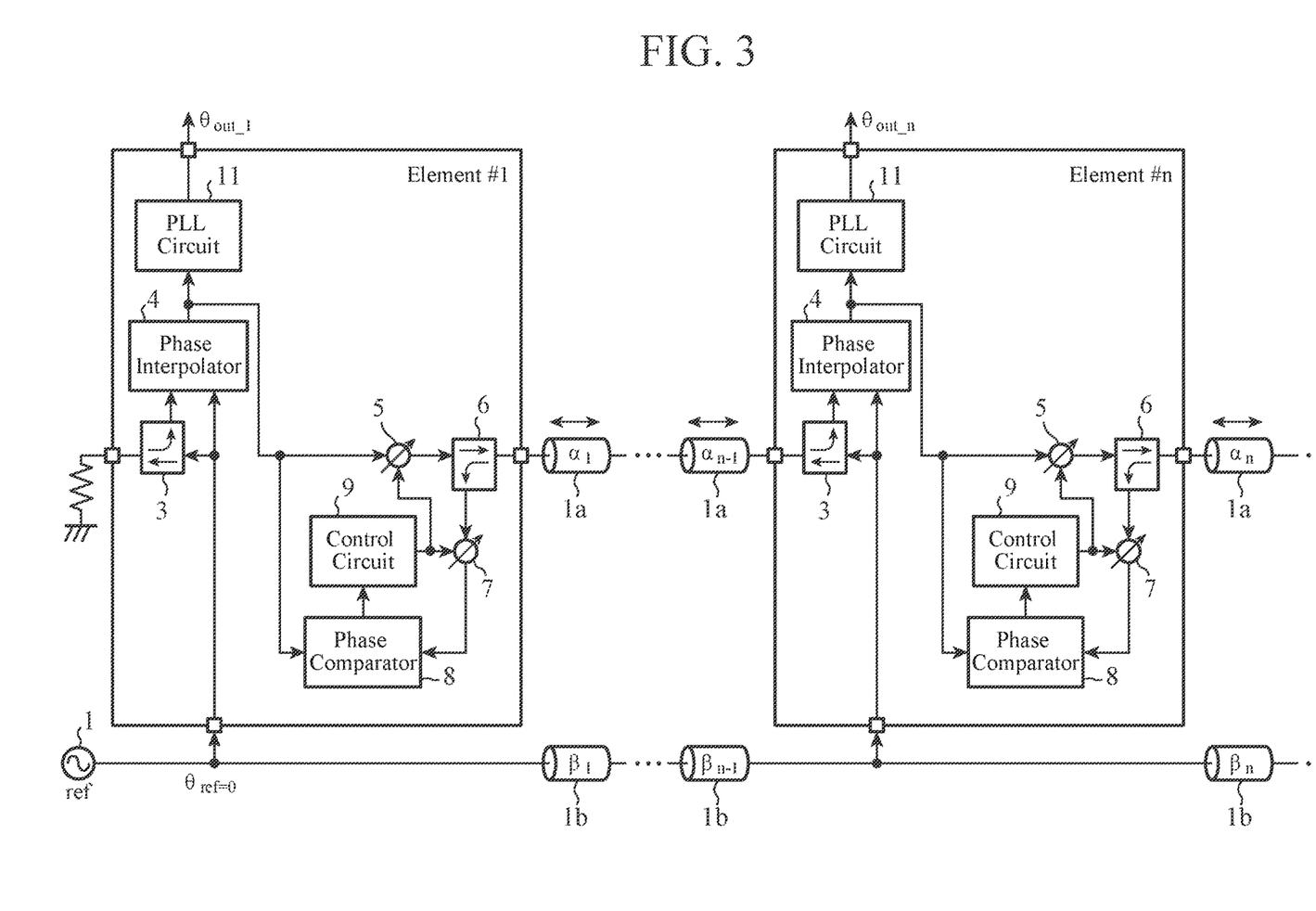
FIG. 3 is a block diagram illustrating a configuration of a phase synchronization device according to a third embodiment.

FIG. 3 is a block diagram illustrating a configuration of a phase synchronization device according to a third embodiment. The phase synchronization device illustrated in FIG. 3 is a device including a plurality of elements, which are cascaded by the line 1a for transmitting and receiving signals to/from each other and a line 1b through which a reference signal from a reference signal source 1 propagates. An element #n includes a directional coupler 3, a phase interpolator 4, a variable phase shifter 5, a directional coupler 6, a variable phase shifter 7, a phase comparator 8, a control circuit 9, and a PLL circuit 11, receives input of a reference signal as a first signal via the line 1b, and generates and outputs a signal with an output phase $\theta_{out\_n}$. Thus, the first signal based on the reference signal input via the line 1b may be the reference signal itself.

The phase synchronization device illustrated in FIG. 3 differs from the phase synchronization device according to the first embodiment in that the PLL circuit 2 illustrated in FIG. 1 is not included and that a PLL circuit 11 is included at the output of the phase interpolator 4. In addition, the directional coupler 3 included in element #n outputs the first signal, which is the reference signal input via the line 1b, to an element #n−1 via the line 1a. Thus, a phase rotation amount $\beta_1+\beta_2+\beta_3+\ldots+\beta_{n-1}$ due to a wire delay is superimposed on the phase of the reference signal output from the element #n to the element #n−1.

The phase interpolator 4 receives input of the first signal, which is the reference signal with the phase $\theta_n$ input from a reference signal source 1 via the line 1b, and a second signal with a phase shifted by a variable phase shifter 5 included in the element #n−1. The phase interpolator 4 generates a third signal having a phase that is intermediate between the first signal and the second signal, and outputs the third signal to the variable phase shifter 5, the phase comparator 8, and the PLL circuit 11. The PLL circuit 11 included in the element #n performs frequency multiplication on the third signal output from the phase interpolator 4 to generate a signal with a frequency higher than that of the reference signal and a phase $\theta_{out\_n}$ and outputs this signal as an output signal.

The variable phase shifter 5 shifts the phase of the third signal output from the phase interpolator 4 by the phase shift amount and outputs the third signal having a phase $\theta_{out\_n}+\gamma_n$ to the directional coupler 6. The directional coupler 6 included in the element #n outputs, as a second signal, the third signal input from the variable phase shifter 5 to an element #n+1 via, the line 1a. While the second signal propagates through the line 1a from the element #n to the element #n+1, a phase rotation amount an due to a wire delay is added to the phase $\theta_{out\_n}+\gamma_n$ of the second signal.

In addition, the directional coupler 6 receives input of a first signal, which is a reference signal with a phase $\theta_{n+1}$ output from a directional coupler 3 included in the subsequent element #n+1 from the element #n+1 via the line 1a, and outputs the first signal to the variable phase shifter 7. While the first signal propagates through the line 1a from the element #n+1 to the element #n, a phase rotation amount $\alpha_n$ due to a wire delay is added to the phase of the first signal.

The variable phase shifter 7 shifts the phase of the first signal with a phase $\theta_{n+1}+\alpha_n$ input from the element #n+1 via the line 1a and the directional coupler 6 by the phase shift amount $\gamma_n$ to generate a fourth signal having a phase $\theta_{n+1}+\alpha_n+\gamma_n$. The fourth signal generated by the variable phase shifter 7 is output to the phase comparator 8.

The phase comparator 8 receives input of the third signal output from the phase interpolator 4 and the fourth signal output from the variable phase shifter 7, and detects a phase difference between these signals. For example, the phase comparator 8 receives input of the third signal having the phase $\theta_{out\_n}$ from the phase interpolator and the fourth signal having the phase $\theta_{n+1}+\alpha_n+\gamma_n$ from the variable phase shifter 7, detects a phase difference between these signals and outputs the detected phase difference to the control circuit 9. The control circuit 9 determines a phase shift amount $\gamma_n$ to reduce the phase difference detected by the phase comparator 8 to zero, and sets the phase shift amount $\gamma_n$ in each of the variable phase shifter 5 and the variable phase shifter 7.

As described above, the phase synchronization device according to the third embodiment includes the elements #1, #2, . . . , #n, . . . In the element #n, the phase interpolator 4 generates the third signal by using the reference signal with the phase $\theta_n$ input via the line 1b, and the PLL circuit 11 performs frequency multiplication on the third signal output from the phase interpolator 4 to generate the output signal. As a result, effects similar to those of the first embodiment can be produced. In addition, in the elements #1, #2, . . . , #n, . . . , the frequency with which phase synchronization is performed is the frequency of the reference signal, and because the frequency of the reference signal is lower than the frequency of the signal on which frequency multiplication is performed by the PLL circuit, attenuation of a signal output from a previous element is reduced.

While the configuration in which the PLL circuit 2 in each of the elements illustrated in FIG. 1 is replaced by the PLL circuit 11 is presented in the description above, the third embodiment can also be applied to the configuration of the elements presented in the second embodiment. For example, the elements included in the phase synchronization device according to the third embodiment may each have a configuration in which the variable phase shifter 7 is not included and the PLL circuit 2 in the elements illustrated in FIG. 2 is replaced by the PLL circuit 11. Such a configuration can also produce effects similar to those of the first and third embodiments.

Fourth Embodiment

Figure 4:
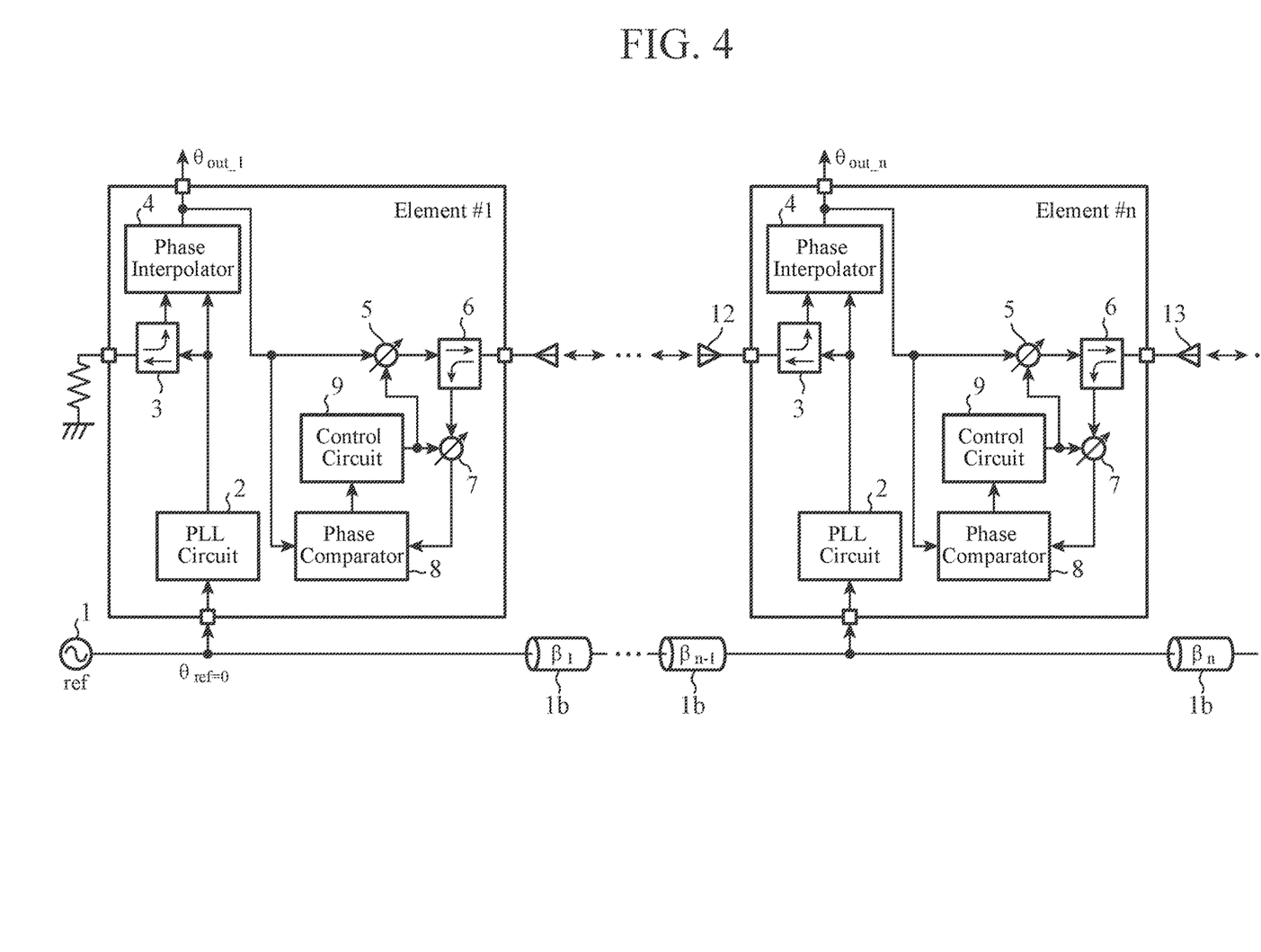
FIG. 4 is a block diagram illustrating a configuration of a phase synchronization device according to a fourth embodiment.

FIG. 4 is a block diagram illustrating a configuration of a phase synchronization device according to a fourth embodiment. The phase synchronization device illustrated in FIG. 4 is a device including a plurality of elements, which are cascaded by a line 1b through which a reference signal from a reference signal source 1, and transmits and receives signals to/from each other by radio transmission using antennas 12 and antennas 13. An element #n includes a directional coupler 3, a phase interpolator 4, a variable phase shifter 5, a directional coupler 6, a variable phase shifter 7, a phase comparator 8, a control circuit 9, and a PLL circuit 2, receives a reference signal via a line 1b, and generates and outputs a signal with a phase $\theta_{out\_n}$.

The directional coupler 3 included in the element #n transmits a first signal with a phase e input from the PLL circuit 2 to an element #n−1 via an antenna 12. A directional coupler 6 included in the element #n−1 receives the first signal from the element #n via an antenna 13. Radio waves radiated from the antennas 12 and the antennas 13 experience phase rotation when propagating through space. Thus, phase rotation amounts $\alpha_1, \alpha_2, \ldots, \alpha_n, \ldots$ are superimposed on signals transmitted and received to/from the elements via, the antennas 12 and the antennas 13.

Note that the phase synchronization device according to the fourth embodiment operates in a manner similar to the first embodiment except that signals are transmitted and received to/from the elements via the antennas 12 and the antennas 13.

As described above, in the phase synchronization device according to the fourth embodiment, each of the elements has the configuration illustrated in FIG. 1, includes an antenna 12 and an antenna 13, and transmits and receives signals to/from each other by radio communication via the antenna 12 and the antenna 13. As a result, effects similar to those of the first embodiment can be produced. Furthermore, in the fourth embodiment, because signals are transmitted and received to/from each other by radio communication, phase synchronization can be performed even when elements are spatially away from each other.

While the configuration in which the antennas 12 and the antennas 13 are introduced in the elements illustrated in FIG.

1 is presented in the description above, the fourth embodiment can be applied to the configuration of the elements presented in the second embodiment and to the configuration of the elements presented in the third embodiment.

For example, the elements included in the phase synchronization device according to the fourth embodiment may each have a configuration in Which an antenna 12 and an antenna 13 are included in each of the elements illustrated in FIG. 2. This configuration can also produce effects similar to those of the first, second, and third embodiments. Furthermore, the elements included in the phase synchronization device according to the fourth embodiment may each have a configuration in which an antenna 12 and an antenna 13 are included in each of the elements illustrated in FIG. 3. This configuration can also produce effects similar to those of the first, second, and third embodiments.

Fifth Embodiment

Figure 5:
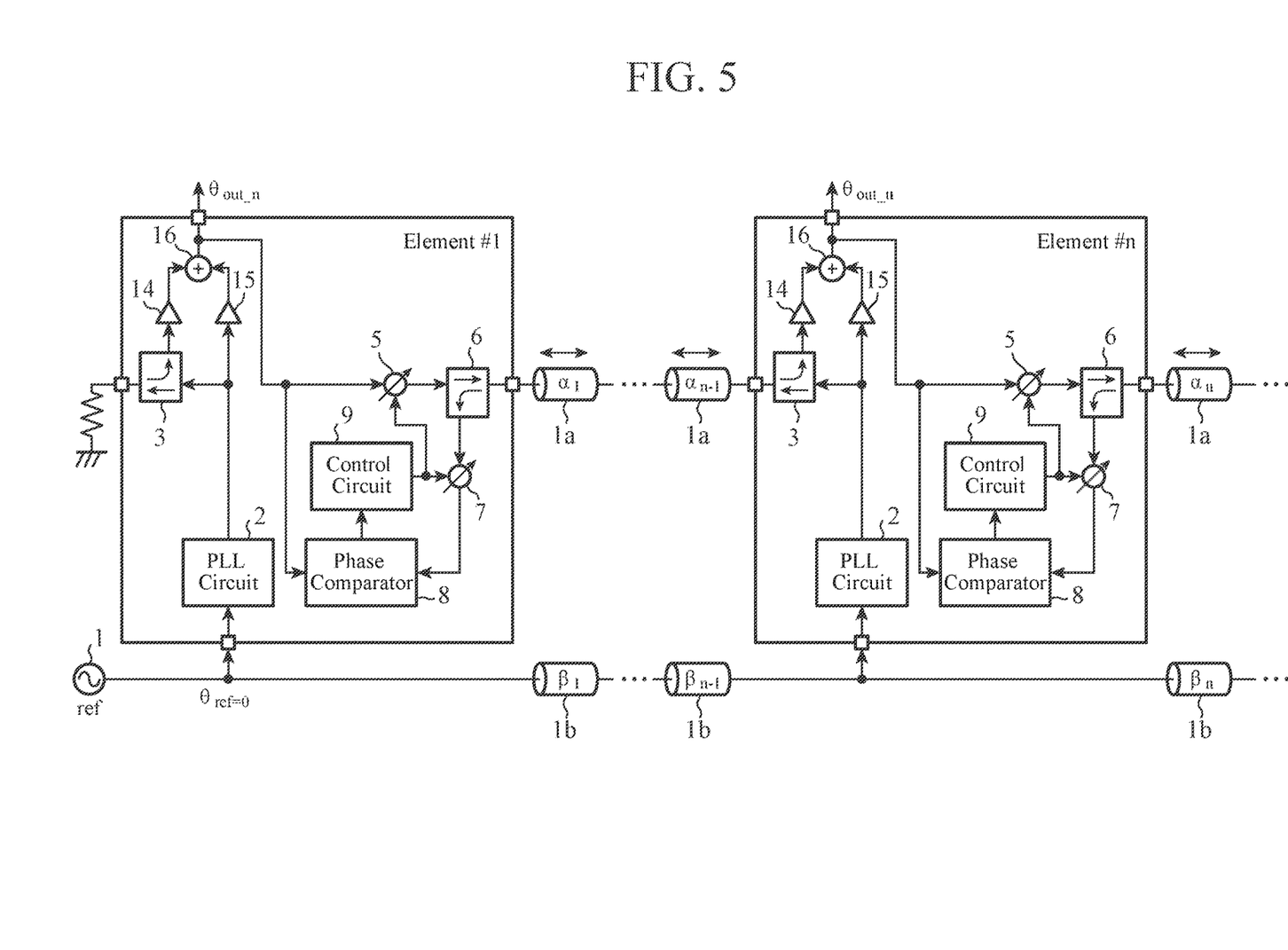
FIG. 5 is a block diagram illustrating a configuration of a phase synchronization device according to a fifth embodiment.
Figure 6:
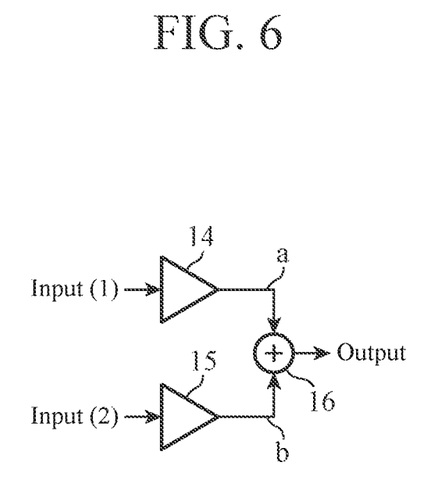
FIG. 6 is a block diagram illustrating a configuration of a please interpolator according to the fifth embodiment.

FIG. 5 is a block diagram illustrating a configuration of a phase synchronization device according to a fifth embodiment, and illustrates a specific configuration of a phase interpolator included in each element. FIG. 6 is a block diagram illustrating a configuration of the phase interpolator in the fifth embodiment, in which only the configuration of the phase interpolator in each of the elements of the phase synchronization device of FIG. 5 is illustrated. The phase interpolator according to the fifth embodiment include an amplifier 14, an amplifier 15, and an adder 16 as illustrated in FIGS. 5 and 6.

The amplifier 14 is a first amplifier that amplifies one (input (1) in FIG. 6; first signal) of two signals input to the phase interpolator to have the same amplitude as the amplifier 15, and outputs the amplified signal "a". The amplifier 15 is a second amplifier that amplifies the other (input (2) in FIG. 6; second signal) of the two signals input to the phase interpolator to have the same amplitude as the amplifier 14, and outputs the amplified signal "b". The signal "a" amplified by the amplifier 14 and the signal "b" amplified by the amplifier 15 are output to the adder 16. The amplifier 14 and the amplifier 15 can be implemented by limiter amplifiers or variable gain amplifiers (VGAs).

The adder 16 is a first adder that adds the signal "a" output from the amplifier 14 and the signal "b" output from the amplifier 15, and outputs a signal (output in FIG. 6) resulting from the addition. When the phase of the signal "a" is $\theta_1$, the signal "a" can be expressed by $\sin(\omega t+\theta_1)$ by using an angular velocity $\omega$ and time t. Similarly, when the phase of the signal "b" is $\theta_2$, the signal "b" can be expressed by $\sin(\omega t+\theta_2)$ by using an angular velocity $\omega$ and time t. The signal obtained by adding the signal "a" and the signal "b" by the adder 16 can be expressed by the following formula (1).

$$\sin(\omega t+\theta_1)+\sin(\omega t+\theta_2)=2\cos\{(\theta_1-\theta_2)/2\}\sin[\omega t+\{(\theta_1+\theta_2)/2\}] \quad (1)$$

In the formula (1), $2\cos\{(\theta_1-\theta_2)/2\}$ expresses the gain of the output signal of the adder 16. In addition, $\sin[\omega t+\{(\theta_1+\theta_2)/2\}]$ expresses the phase of the output signal of the adder 16, and the output phase is an average of the phases of the signal "a" input to the amplifier 14 and the signal "b" input to the amplifier 15.

As described above, in the phase synchronization device according to the fifth embodiment, each of the elements includes the phase interpolator constituted by the amplifier 14, the amplifier 15, and the adder 16. This configuration enables phase synchronization even when signals transmitted and received to/from the elements have different amplitudes from each other.

Note that the phase synchronization device in which each of the phase interpolators 4 illustrated in FIG. 1 is replaced by the phase interpolator illustrated in FIG. 6 is presented in the description above. Note that, the phase synchronization device according to the fifth embodiment may be a device in which each of the phase interpolators 4 presented in any of the second to fourth embodiments is replaced by the phase interpolator illustrated in FIG. 6, which can produce effects similar to those described above.

Sixth Embodiment

Figure 7:
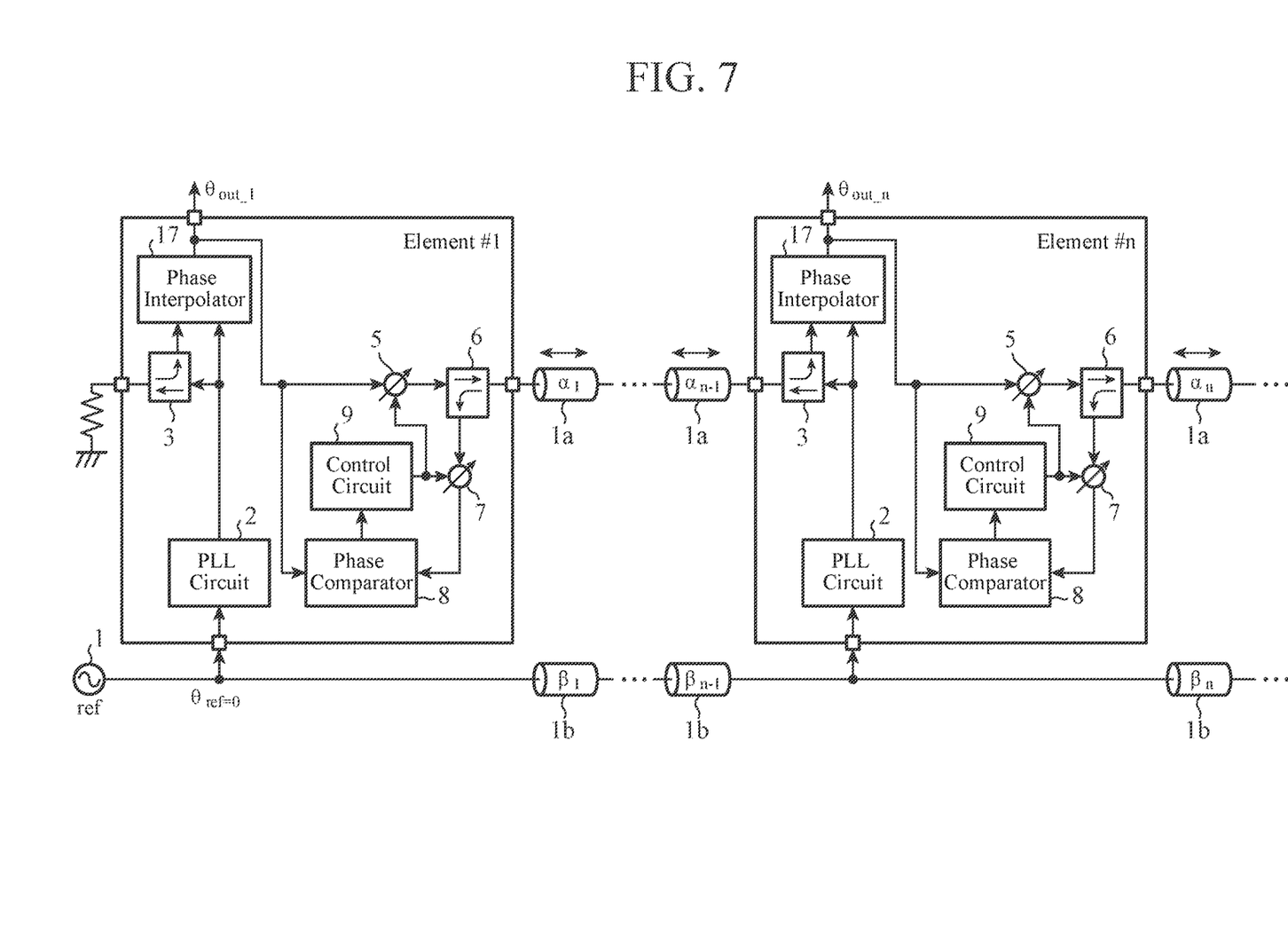
FIG. 7 is a block diagram illustrating a configuration of a phase synchronization device according to a sixth embodiment.
Figure 8:
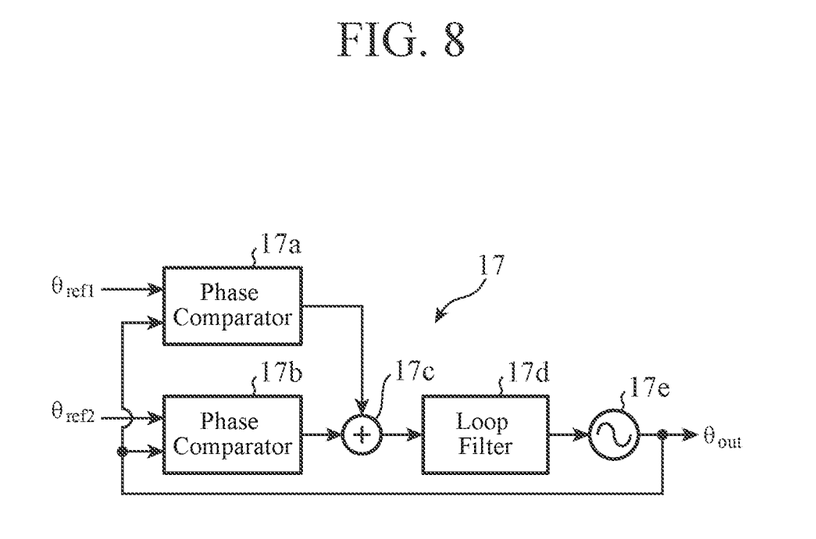
FIG. 8 is a block diagram illustrating a configuration of a phase interpolator according to the sixth embodiment.

FIG. 7 is a block diagram illustrating a configuration of a phase synchronization device according to a sixth embodiment, in which each element includes a phase interpolator 17. FIG. 8 is a block diagram illustrating a configuration of the phase interpolator 17, and illustrates an internal configuration of the phase interpolator 17. As illustrated in FIG. 8, the phase interpolator 17 includes a phase comparator 17a, a phase comparator 17b, an adder 17c, a loop filter 17d, and a frequency variable oscillation circuit 17e.

The phase comparator 17a is a first phase comparator that detects a phase difference between one (first signal) of two signals input to the phase interpolator 17 and an output signal generated by the frequency variable oscillation circuit 17e, and outputs a signal proportional to the detected phase difference. Note that the one signal is a reference signal with a phase $\theta_{ref1}$. The reference signal with the phase $\theta_{ref1}$ is input to the phase comparator 17a, and the output signal generated by the frequency variable oscillation circuit 17e is further returned to the input of the phase comparator 17a.

The phase comparator 17b is a second phase comparator that detects a phase difference between the other (second signal) of the two signals input to the phase interpolator 17 and an output signal generated by the frequency variable oscillation circuit 17e, and outputs a signal proportional to the detected phase difference. Note that the other signal is a reference signal with a phase Oren different from $\theta_{ref1}$. The reference signal with the phase $\theta_{ref2}$ is input to the phase comparator 17b, and the output signal generated by the frequency variable oscillation circuit 17e is further returned to the input of the phase comparator 17b.

The adder 17c is a second adder that adds a signal output from the phase comparator 17a and a signal output from the phase comparator 17b. A signal resulting from the addition by the adder 17c is output to the loop filter 17d, The loop filter 17d smooths the signal resulting from the addition by the adder 17c, and outputs the smoothed signal to the frequency variable oscillation circuit 17e. The frequency variable oscillation circuit 17e is a first frequency variable oscillation circuit that generates an output signal of the phase interpolator 17.

In addition, the frequency variable oscillation circuit 17e changes the frequency of the output signal of the phase interpolator 17 on the basis of the signal smoothed by the loop filter 17d. When the phases of the reference signals input to the phase comparator 17a and the phase comparator 17b are $\theta_{ref1}$ and $\theta_{ref2}$, respectively, the phase $\theta_{out}$ of the output signal generated by the frequency variable oscillation circuit 17e is an average ($\theta_{out}=(\theta_{ref1}+\theta_{ref2})/2$) of the phases $\theta_{ref1}$ and $\theta_{ref2}$. Specifically, when the reference signal with the phase $\theta_{ref1}$ and the reference signal with the phase $\theta_{ref2}$ are input, the signal output from the phase interpolator 17 is a signal having a phase that is intermediate between the reference signals.

As described above, in the phase synchronization device according to the sixth embodiment, the phase interpolator 17 includes the phase comparator 17a, the phase comparator 17b, the adder 17c, the loop filter 17d, and the frequency variable oscillation circuit 17e, In the phase interpolator 17, the phase interpolation accuracy is determined by the comparison accuracies of the phase comparator 17a and the phase comparator 17b, and the phase synchronization device according to the sixth embodiment thus produces an effect of increasing the accuracy of phase interpolation more easily than the phase synchronization device presented in the fifth embodiment.

Note that the phase synchronization device in which each of the phase interpolators 4 illustrated in FIG. 1 is replaced by the phase interpolator 17 illustrated in FIG. 8 is presented in the description above. Note that, the phase synchronization device according to the sixth embodiment may be a device in which each of the phase interpolators 4 included in the phase synchronization device illustrated in the second to fourth embodiments is replaced by the phase interpolator 17, which can produce effects similar to those described above.

Seventh Embodiment

Figure 9:
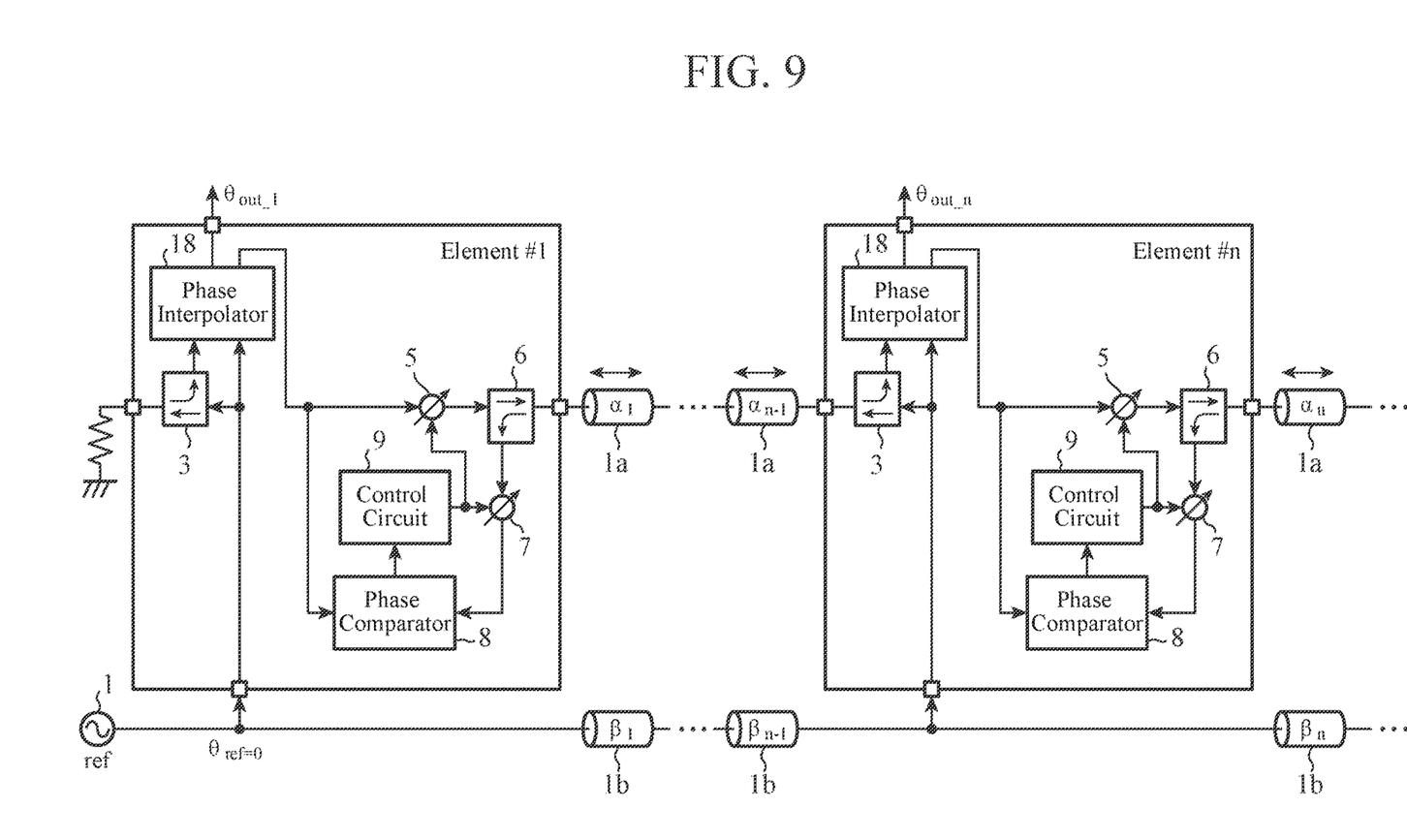
FIG. 9 is a block diagram illustrating a configuration of a phase synchronization device according to a seventh embodiment.

FIG. 9 is a block diagram illustrating a configuration of a phase synchronization device according to a seventh embodiment. The phase synchronization device illustrated in FIG. 9 has a configuration similar to that of the phase synchronization device illustrated in FIG. 3, but each of the elements does not include the PLL circuit 11 illustrated in FIG. 3. and the phase interpolator 4 is replaced by a phase interpolator 18. In addition, an output of a frequency divider 18f included in the phase interpolator 18 is given to the variable phase shifter 5 and the phase comparator 8. An output signal of each of the elements is an output signal of the phase interpolator 18.

Figure 10:
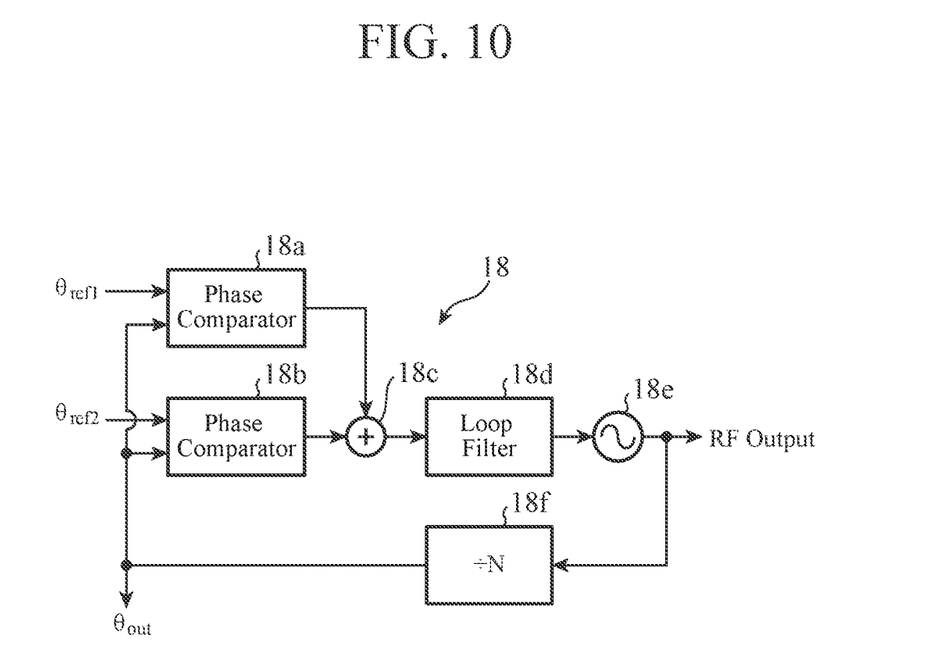
FIG. 10 is a block diagram illustrating a configuration of a phase interpolator according to the seventh embodiment.

FIG. 10 is a block diagram illustrating a configuration of the phase interpolator 18, and illustrates an internal configuration of the phase interpolator 18. As illustrated in FIG. 10, the phase interpolator 18 includes a phase comparator 18a, a phase comparator 18b, an adder 18c, a loop filter 18d, a frequency variable oscillation circuit 18e, and the frequency divider 18f Note that, the frequency divider 18f is described as "÷N" in FIG. 10.

The phase comparator 18a is a third phase comparator that detects a phase difference between one of two signals input to the phase interpolator 18 and an output signal generated by the frequency variable oscillation circuit 18e, and outputs a signal proportional to the detected phase difference. Note that the one signal is a reference signal with a phase $\theta_{ref1}$. The reference signal with the phase $\theta_{ref1}$ is input to the phase comparator 18a, and the output signal generated by the frequency variable oscillation circuit 18e is further returned to the input of the phase comparator 18a.

The phase comparator 18b is a fourth phase comparator that detects a phase difference between the other of two signals input to the phase interpolator 18 and an output signal generated by the frequency variable oscillation circuit 18e, and outputs a signal proportional to the detected phase difference. The other signal is a reference signal with a phase $\theta_{ref2}$ different from $\theta_{ref1}$. The reference signal with the phase $\theta_{ref2}$ is input to the phase comparator 18b, and the output signal generated by the frequency variable oscillation circuit 18e is further returned to the input of the phase comparator 18b.

The adder 18c is a third adder that adds a signal output from the phase comparator 18a and a signal output from the phase comparator 18b. A signal resulting from the addition by the adder 18c is output to the loop filter 18d. The loop filter 18d smooths the signal output from the adder 18c, and outputs the smoothed signal to the frequency variable oscillation circuit 18e. The frequency variable oscillation circuit 18e is a second frequency variable oscillation circuit that generates an output signal of the phase interpolator 18. In addition, the frequency variable oscillation circuit 18e changes the frequency of the output signal of the phase interpolator 18 on the basis of the signal smoothed by the loop filter 18d.

The frequency divider 18f is a frequency divider that divides the frequency of the output signal generated by the frequency variable oscillation circuit 18e. Thus, the output signal of the frequency variable oscillation circuit 18e is divided in frequency by the frequency divider 18f, and then returned to the inputs of the phase comparator 18a and the phase comparator 18b.

A phase rotation amount due to the delay of the dividing process of the frequency divider 18f is superimposed on the phase of the output signal (RF output) of the phase interpolator 18, and the phase Om of a signal output from the frequency divider 18f is $\theta_{out}=(\theta_{ref1}+\theta_{ref2})/2$.

As described above, in the phase synchronization device according to the seventh embodiment, the phase interpolator 18 includes the phase comparator 18a, the phase comparator 18b, the adder 18c, the loop filter 18d, the frequency variable oscillation circuit 18e, and the frequency divider 18f Because the phase interpolator 18 can perform phase interpolation and frequency multiplication on the two input reference signals (phases $\theta_{ref1}$ and $\theta_{ref2}$) at the same time, the phase synchronization device according to the seventh embodiment produces an effect of enabling reduction in power consumption as compared with the phase synchronization device presented in the sixth embodiment.

Note that the phase synchronization device in which each of the phase interpolators 4 illustrated in FIG. 3 is replaced by the phase interpolator 18 illustrated in FIG. 10 is presented in the description above. Note that, the phase synchronization device according to the seventh embodiment may be a device in which each of the phase interpolators 4 included in the phase synchronization devices presented in the first, second, and fourth embodiments is replaced with the phase interpolator 18, the PLL circuits 2 are further deleted, and the output of each of the frequency dividers is given to the variable phase shifter 5 and the phase comparator 8, which can produce effects similar to those described above.

Note that the present invention is not limited to the embodiments described above, and the embodiments can be freely combined, any components in the embodiments can be modified, or any components in the embodiments can be omitted within the scope of the invention.

INDUSTRIAL APPLICABILITY

A phase synchronization device according to the present invention can make the phases of signals output from a plurality of elements equal to each other, and can thus be used for an APAA.

REFERENCE SIGNS LIST

1: reference signal source,
1a and 1b: line,
2 and 11: PLL circuit,
3 and 6: directional coupler,
4, 17, and 18: phase interpolator,
6 and 7: variable phase shifter,
8, 17a, 17b, 18a, and 18b: phase comparator,
9: control circuit,
12 and 13: antenna,
14 and 15: amplifier,
16, 17c, and 18c: adder,
17d and 18d: loop filter,
17e and 18e: frequency variable oscillation circuit,
18f: frequency divider

What is claimed is:

1. A phase synchronization device comprising a plurality of cascaded elements, including first and second elements associated, respectively, with stage one and stage two of the phase synchronization device, the first and second elements each including a phase interpolator, a phase shifter, a phase comparator, and a control circuit, wherein
the phase interpolator of the second element receives input of a stage two first signal based on a stage two reference signal input to the second element via a line, receives a stage one second signal output from the phase shifter of the first element, and generates and outputs a stage two third signal having a phase intermediate between the stage two first signal and the stage one second signal,
the phase shifter of the first element outputs, as the stage one second signal, a stage one third signal with a phase shifted by a first phase shift amount,
the phase comparator of the first element detects a phase difference between the stage one third signal and a stage one fourth signal obtained by shifting a phase of the stage two first signal output from the second element by the first phase shift amount, and
the control circuit of the first element controls the first phase shift amount for the phase shifter of the first element on a basis of the phase difference detected by the phase comparator of the first element.

2. The phase synchronization device according to claim 1, wherein
the phase shifter of each of the first and second elements includes a first phase shifter and a second phase shifter,
the first phase shifter of the first element outputs, as the stage one second signal, a signal obtained by shifting a phase of the stage one third signal by the first phase shift amount to the phase interpolator of the second element,
the second phase shifter of the first element shifts the stage two first signal output from the second element by the first phase shift amount to generate the stage one fourth signal, and
the control circuit of the first element controls the first phase shift amount for each of the first phase shifter and the second phase shifter of the first element on a basis of the phase difference detected by the phase comparator.

3. The phase synchronization device according to claim 2, wherein
the first and second elements each include an antenna, and transmit and receive signals to from each other by radio communication via the antenna.

4. The phase synchronization device according to claim 2, wherein
the phase interpolator of each of the first and second elements includes a first amplifier, a second amplifier, and a first adder,
the first amplifier amplifies a first one of two signals input to the phase interpolator to have an amplitude equal to an amplitude of the second amplifier, and output the amplified signal,
the second amplifier amplifies a second one of the two signals input to the phase interpolator to have an amplitude equal to an amplitude of the first amplifier, and output the amplified signal, and
the first adder adds the signal output from the first amplifier and the signal output from the second amplifier, and outputs a signal resulting from the addition.

5. The phase synchronization device according to claim 2, wherein
the phase interpolator of each of the first and second elements includes:
a first frequency variable oscillation circuit to generate an output signal of the phase interpolator;
a first phase comparator to detect a phase difference between a first one of two signals input to the phase interpolator and the output signal generated by the first frequency variable oscillation circuit, and to output a signal proportional to the detected phase difference;
a second phase comparator to detect a phase difference between a second one of the two signals input to the phase interpolator and the output signal generated by the first frequency variable oscillation circuit, and to output a signal proportional to the detected phase difference;
a second adder to add the signal output from the first phase comparator and the signal output from the second phase comparator; and
a loop filter to smooth a signal resulting from the addition by the second adder, and to output the smoothed signal to the first frequency variable oscillation circuit, and
the first frequency variable oscillation circuit changes a frequency of the output signal of the phase interpolator on a basis of the signal smoothed by the loop filter.

6. The phase synchronization device according to claim 2, wherein
the phase interpolator of each of the first and second elements includes:
a second frequency variable oscillation circuit to generate an output signal of the phase interpolator;
a frequency divider to divide a frequency of the output signal generated by the second frequency variable oscillation circuit;
a third phase comparator to detect a phase difference between a first one of two signals input to the phase interpolator and a signal obtained by frequency division by the frequency divider, and to output a signal proportional to the detected phase difference;
a fourth phase comparator to detect a phase difference between a second one of the two signals input to the phase interpolator and a signal obtained by frequency division by the frequency divider, and to output a signal proportional to the detected phase difference;
a third adder to add the signal output from the third phase comparator and the signal output from the fourth phase comparator; and
a loop filter to smooth a signal resulting from the addition by the third adder, and to output the smoothed signal to the second frequency variable oscillation circuit, and the second frequency variable oscillation circuit changes a frequency of the output signal of the phase interpolator on a basis of the signal smoothed by the loop filter.

7. The phase synchronization device according to claim 1, wherein
the phase shifter of each of the first and second elements is a bidirectional phase shifter,
the bidirectional phase shifter of the first element outputs, as the stage one second signal, a signal obtained by shifting a phase of the stage one third signal by the first phase shift amount to the phase interpolator of the second element, and
the phase comparator of the first element detects a phase difference between the stage one third signal and the stage one fourth signal obtained by shifting a phase of the stage two first signal output from the second element by the first phase shift amount by the bidirectional phase shifter of the first element, and
the control circuit of the first element controls the first phase shift amount for the bidirectional phase shifter on a basis of the phase difference detected by the phase comparator of the first element.

8. The phase synchronization device according to claim 7, wherein
the first and second elements each include an antenna, and transmit and receive signals to from each other by radio communication via the antenna.

9. The phase synchronization device according to claim 7, wherein
the phase interpolator of each of the first and second elements includes a first amplifier, a second amplifier, and a first adder,
the first amplifier amplifies a first one of two signals input to the phase interpolator to have an amplitude equal to an amplitude of the second amplifier, and output the amplified signal,
the second amplifier amplifies a second one of the two signals input to the phase interpolator to have an amplitude equal to an amplitude of the first amplifier, and output the amplified signal, and
the first adder adds the signal output from the first amplifier and the signal output from the second amplifier, and outputs a signal resulting from the addition.

10. The phase synchronization device according to claim 7, wherein
the phase interpolator of each of the first and second elements includes:
a first frequency variable oscillation circuit to generate an output signal of the phase interpolator;
a first phase comparator to detect a phase difference between a first one of two signals input to the phase interpolator and the output signal generated by the first frequency variable oscillation circuit, and to output a signal proportional to the detected phase difference;
a second phase comparator to detect a phase difference between a second one of the two signals input to the phase interpolator and the output signal generated by the first frequency variable oscillation circuit, and to output a signal proportional to the detected phase difference;
a second adder to add the signal output from the first phase comparator and the signal output from the second phase comparator; and
a loop filter to smooth a signal resulting from the addition by the second adder, and to output the smoothed signal to the first frequency variable oscillation circuit, and the first frequency variable oscillation circuit changes a frequency of the output signal of the phase interpolator on a basis of the signal smoothed by the loop filter.

11. The phase synchronization device according to claim 7, wherein
the phase interpolator of each of the first and second elements includes:
a second frequency variable oscillation circuit to generate an output signal of the phase interpolator;
a frequency divider to divide a frequency of the output signal generated by the second frequency variable oscillation circuit;
a third phase comparator to detect a phase difference between a first one of two signals input to the phase interpolator and a signal obtained by frequency division by the frequency divider, and to output a signal proportional to the detected phase difference;
a fourth phase comparator to detect a phase difference between a second one of the two signals input to the phase interpolator and a signal obtained by frequency division by the frequency divider, and to output a signal proportional to the detected phase difference;
a third adder to add the signal output from the third phase comparator and the signal output from the fourth phase comparator; and
a loop filter to smooth a signal resulting from the addition by the third adder, and to output the smoothed signal to the second frequency variable oscillation circuit, and
the second frequency variable oscillation circuit changes a frequency of the output signal of the phase interpolator on a basis of the signal smoothed by the loop filter.

12. The phase synchronization device according to claim 1, wherein:
each of the first and second elements includes a phase synchronization circuit, and
the phase synchronization circuit of the second element is disposed on an output side of the phase interpolator of the second element, the phase synchronization circuit of the second element generating and outputting a signal obtained by performing frequency multiplication on the stage two third signal.

13. The phase synchronization device according to claim 12, wherein
the first and second elements each include an antenna, and transmit and receive signals to from each other by radio communication via the antenna.

14. The phase synchronization device according to claim 12, wherein
the phase interpolator of each of the first and second elements includes a first amplifier, a second amplifier, and a first adder,
the first amplifier amplifies a first one of two signals input to the phase interpolator to have an amplitude equal to an amplitude of the second amplifier, and output the amplified signal,
the second amplifier amplifies a second one of the two signals input to the phase interpolator to have an amplitude equal to an amplitude of the first amplifier, and output the amplified signal, and
the first adder adds the signal output from the first amplifier and the signal output from the second amplifier, and outputs a signal resulting from the addition.

15. The phase synchronization device according to claim 12, wherein
the phase interpolator of each of the first and second elements includes:

a first frequency variable oscillation circuit to generate an output signal of the phase interpolator;

a first phase comparator to detect a phase difference between a first one of two signals input to the phase interpolator and the output signal generated by the first frequency variable oscillation circuit, and to output a signal proportional to the detected phase difference;

a second phase comparator to detect a phase difference between a second one of the two signals input to the phase interpolator and the output signal generated by the first frequency variable oscillation circuit, and to output a signal proportional to the detected phase difference;

a second adder to add the signal output from the first phase comparator and the signal output from the second phase comparator; and a loop filter to smooth a signal resulting from the addition by the second adder, and to output the smoothed signal to the first frequency variable oscillation circuit, and the first frequency variable oscillation circuit changes a frequency of the output signal of the phase interpolator on a basis of the signal smoothed by the loop filter.

16. The phase synchronization device according to claim 12, wherein the phase interpolator of each of the first and second elements includes:

a second frequency variable oscillation circuit to generate an output signal of the phase interpolator;

a frequency divider to divide a frequency of the output signal generated by the second frequency variable oscillation circuit;

a third phase comparator to detect a phase difference between a first one of two signals input to the phase interpolator and a signal obtained by frequency division by the frequency divider, and to output a signal proportional to the detected phase difference;

a fourth phase comparator to detect a phase difference between a second one of the two signals input to the phase interpolator and a signal obtained by frequency division by the frequency divider, and to output a signal proportional to the detected phase difference;

a third adder to add the signal output from the third phase comparator and the signal output from the fourth phase comparator; and a loop filter to smooth a signal resulting from the addition by the third adder, and to output the smoothed signal to the second frequency variable oscillation circuit, and the second frequency variable oscillation circuit changes a frequency of the output signal of the phase interpolator on a basis of the signal smoothed by the loop filter.

17. The phase synchronization device according to claim 1, wherein the first and second elements each include an antenna, and transmit and receive signals to from each other by radio communication via the antenna.

18. The phase synchronization device according to claim 1, wherein the phase interpolator of each of the first and second elements includes a first amplifier, a second amplifier, and a first adder, the first amplifier amplifies a first one of two signals input to the phase interpolator to have an amplitude equal to an amplitude of the second amplifier, and output the amplified signal, the second amplifier amplifies a second one of the two signals input to the phase interpolator to have an amplitude equal to an amplitude of the first amplifier, and output the amplified signal, and the first adder adds the signal output from the first amplifier and the signal output from the second amplifier, and outputs a signal resulting from the addition.

19. The phase synchronization device according to claim 1, wherein the phase interpolator of each of the first and second elements includes:

a first frequency variable oscillation circuit to generate an output signal of the phase interpolator;

a first phase comparator to detect a phase difference between a first one of two signals input to the phase interpolator and the output signal generated by the first frequency variable oscillation circuit, and to output a signal proportional to the detected phase difference;

a second phase comparator to detect a phase difference between a second one of the two signals input to the phase interpolator and the output signal generated by the first frequency variable oscillation circuit, and to output a signal proportional to the detected phase difference;

a second adder to add the signal output from the first phase comparator and the signal output from the second phase comparator; and a loop filter to smooth a signal resulting from the addition by the second adder, and to output the smoothed signal to the first frequency variable oscillation circuit, and the first frequency variable oscillation circuit changes a frequency of the output signal of the phase interpolator on a basis of the signal smoothed by the loop filter.

20. The phase synchronization device according to claim 1, wherein the phase interpolator of each of the first and second elements includes:

a second frequency variable oscillation circuit to generate an output signal of the phase interpolator;

a frequency divider to divide a frequency of the output signal generated by the second frequency variable oscillation circuit;

a third phase comparator to detect a phase difference between a first one of two signals input to the phase interpolator and a signal obtained by frequency division by the frequency divider, and to output a signal proportional to the detected phase difference;

a fourth phase comparator to detect a phase difference between a second one of the two signals input to the phase interpolator and a signal obtained by frequency division by the frequency divider, and to output a signal proportional to the detected phase difference;

a third adder to add the signal output from the third phase comparator and the signal output from the fourth phase comparator; and a loop filter to smooth a signal resulting from the addition by the third adder, and to output the smoothed signal to the second frequency variable oscillation circuit, and the second frequency variable oscillation circuit changes a frequency of the output signal of the phase interpolator on a basis of the signal smoothed by the loop filter.

\* \* \* \* \*